(12) United States Patent
Lee et al.

(10) Patent No.: US 11,521,940 B2
(45) Date of Patent: Dec. 6, 2022

(54) STIFFENER FOR DIE CRACK PREVENTION IN SEMICONDUCTOR PACKAGES

(71) Applicant: Intel Corporation, Santa Clara, CA (US)

(72) Inventors: Eng Kwong Lee, Pinang (MY); Chew Ching Lim, Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 114 days.

(21) Appl. No.: 17/088,666

(22) Filed: Nov. 4, 2020

(65) Prior Publication Data

US 2022/0068842 A1    Mar. 3, 2022

(30) Foreign Application Priority Data

Aug. 28, 2020 (MY) .............................. PI2020004462

(51) Int. Cl.

| | |
|---|---|
| *H01L 23/00* | (2006.01) |
| *H01L 23/16* | (2006.01) |
| *H01L 23/367* | (2006.01) |
| *H01L 23/427* | (2006.01) |
| *H01L 21/48* | (2006.01) |

(52) U.S. Cl.
CPC ........ *H01L 23/562* (2013.01); *H01L 21/4882* (2013.01); *H01L 23/16* (2013.01); *H01L 23/3672* (2013.01); *H01L 23/427* (2013.01)

(58) Field of Classification Search
CPC ... H01L 23/562; H01L 23/16; H01L 23/3672; H01L 23/427; H01L 21/4882
See application file for complete search history.

(56) References Cited

U.S. PATENT DOCUMENTS

| | | | | |
|---|---|---|---|---|
| 5,504,652 | A  * | 4/1996 | Foster ................. | H01L 23/4006 257/E23.084 |
| 6,562,655 | B1 * | 5/2003 | Glenn ................. | H01L 23/4334 257/E23.092 |

* cited by examiner

*Primary Examiner* — Peniel M Gumedzoe

(74) *Attorney, Agent, or Firm* — Viering, Jentschura & Partner mbB

(57) ABSTRACT

The present disclosure relates to a semiconductor package that may include a substrate, at least one die coupled to the substrate, and a stiffener coupled to the substrate, wherein the stiffener may include a stiffener frame, wherein the stiffener frame at least partially surrounds the at least one die. The stiffener may include at least one resilient member extending from the stiffener frame towards the at least one die, and the at least one resilient member may include a distal end that extends at a height above the substrate.

16 Claims, 10 Drawing Sheets

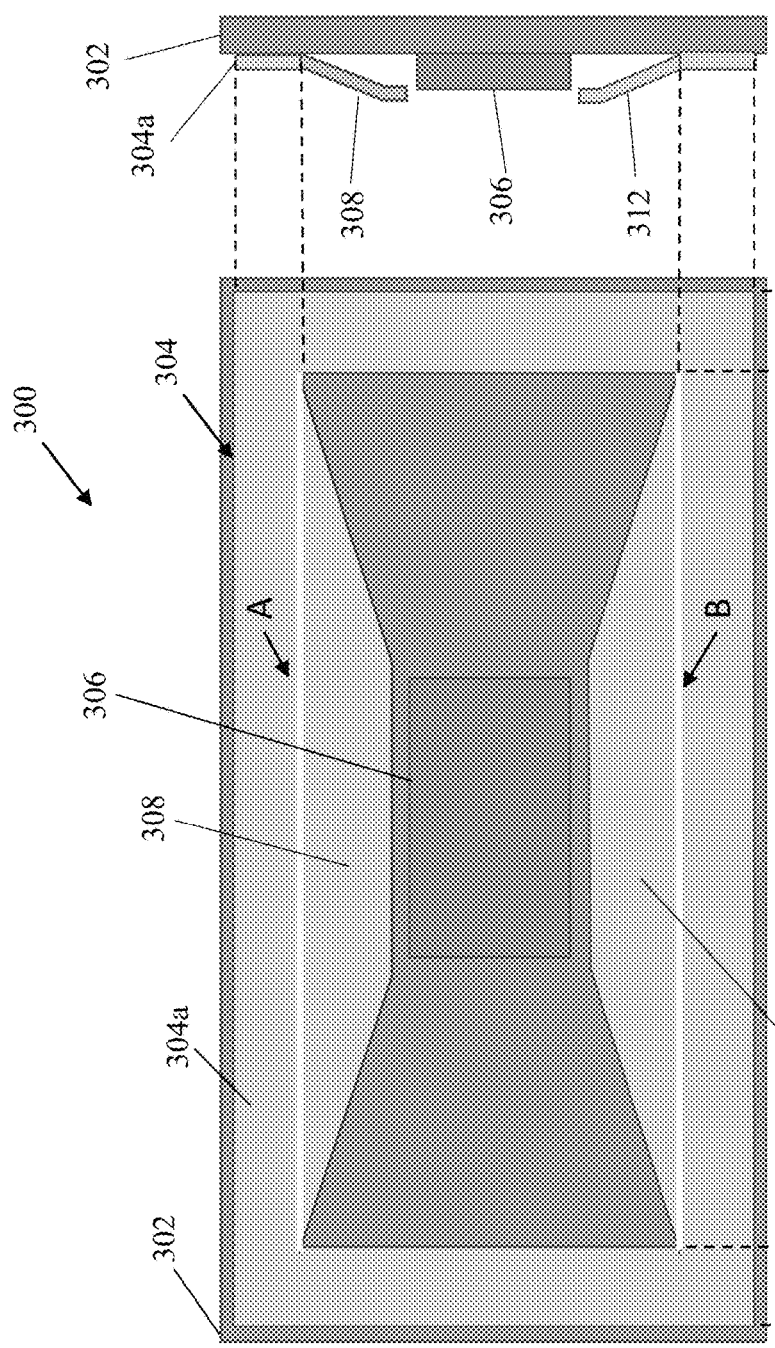
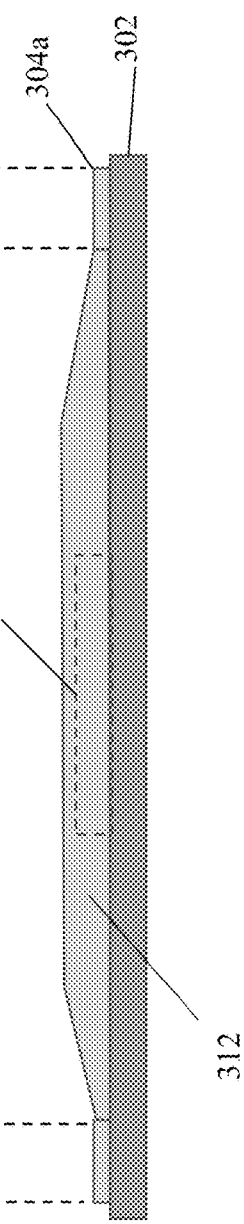
FIG. 3A
FIG. 3B
FIG. 3C

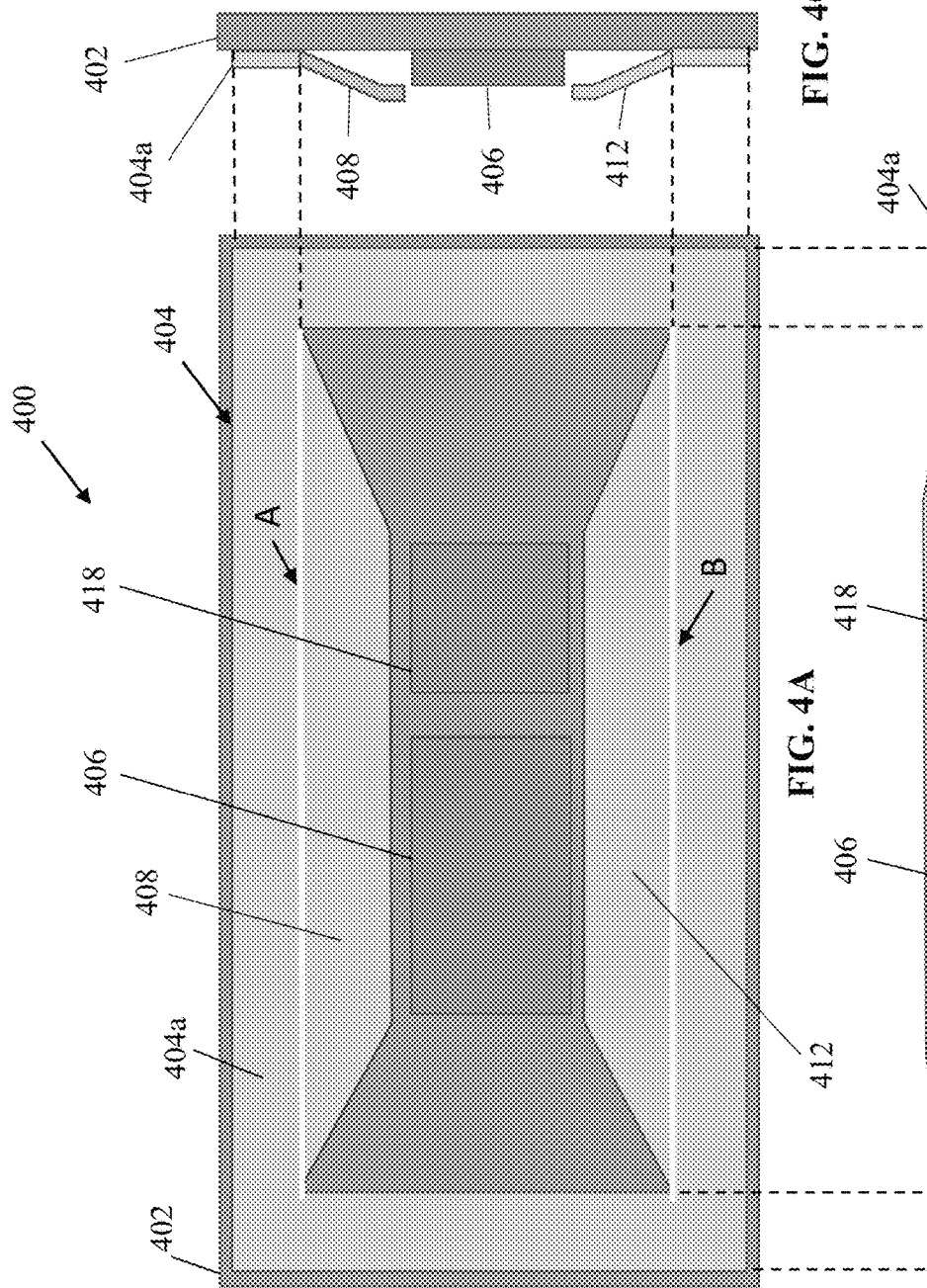
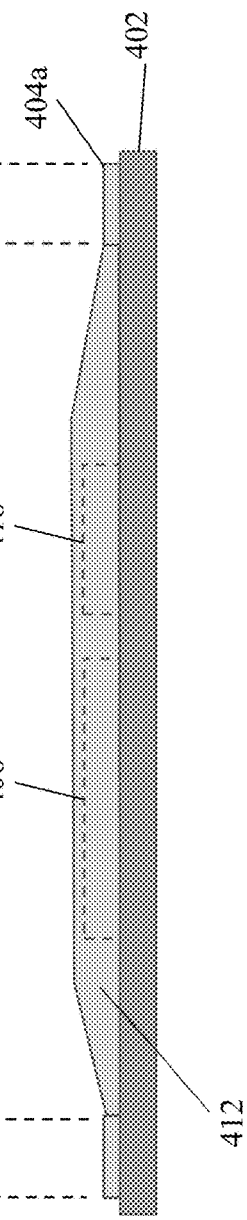
FIG. 4A
FIG. 4B
FIG. 4C

STIFFENER FOR DIE CRACK PREVENTION IN SEMICONDUCTOR PACKAGES

CROSS-REFERENCE TO RELATED APPLICATIONS

This non-provisional application claims priority to Malaysian Application No. PI2020004462, filed on Aug. 28, 2020, which is incorporated by reference herein in its entirety.

BACKGROUND

Die edge crack is a common problem that occurs during the installation of thermal solutions, such as a heat sink and a heat pipe pedestal, onto a die, e.g., a processor. The metal base of the heat sink tends to tilt and exert pressure on an edge of the die, which could cause damage, such as a crack.

Ideally, the heat sink is evenly installed or loaded onto a surface of the die, i.e., to distribute the load on the die as uniformly as possible, to minimize the risk of damage. However, there are many factors in a factory assembly line that cannot be accounted for, such as human error from an operator, or the assembly process of each manufacturer, which contribute to the risk.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 3A shows a top view of a semiconductor package according to another aspect of the present disclosure;

FIG. 3B shows a front view of a semiconductor package according to the aspect shown in FIG. 3A;

FIG. 3C shows a side view of a semiconductor package according to the aspect shown in FIG. 3A;

FIG. 4A shows a top view of a semiconductor package according to another aspect of the present disclosure;

FIG. 4B shows a front view of a semiconductor package according to the aspect shown in FIG. 4A;

FIG. 4C shows a side view of a semiconductor package according to the aspect shown in FIG. 4A;

DETAILED DESCRIPTION

Figures 1A, 1B:
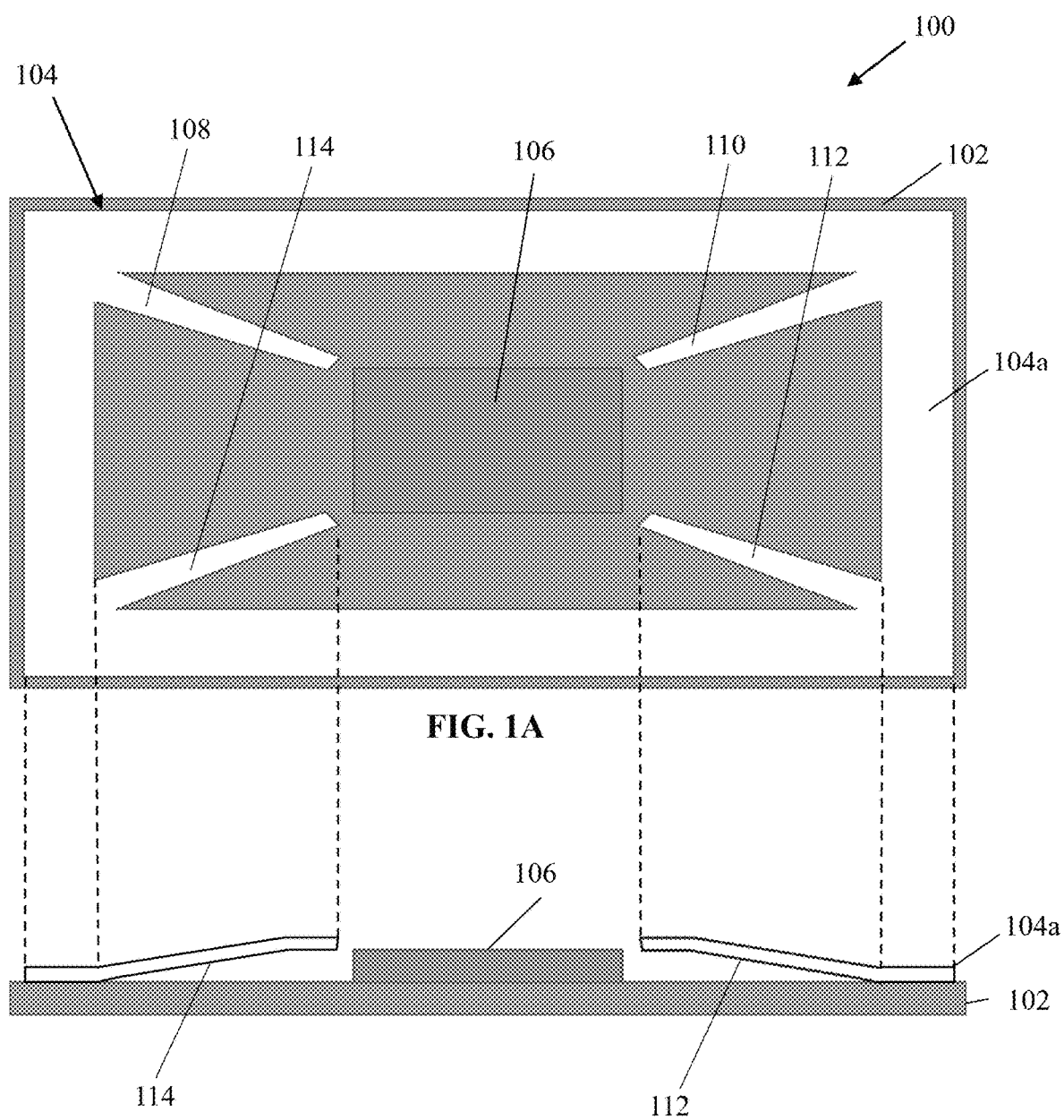
FIG. 1A shows a top view of a semiconductor package according to an aspect of the present disclosure.
FIG. 1B shows a front view of a semiconductor package according to the aspect as shown in FIG. 1A.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to a semiconductor package that may include a substrate, at least one die coupled to the substrate, and a stiffener coupled to the substrate. The stiffener may include a stiffener frame, wherein the stiffener frame at least partially surrounds the at least one die. The stiffener may further include at least one resilient member extending from the stiffener frame towards the at least one die, the at least one resilient member including a distal end that extends at a height above the substrate. As used herein, it should be understood that the term stiffener includes at least one resilient member.

In various aspects, the distal end of the at least one resilient member may be spaced apart from the at least one die.

In various aspects, the height of the distal end of the at least one resilient member may be greater than a height of the at least one die.

The present disclosure also generally relates to a computing device. The computing device may include a circuit board and a semiconductor package coupled to the circuit board. The semiconductor package may include a substrate, at least one die coupled to the substrate, and a stiffener coupled to the substrate. The stiffener may include a stiffener frame, wherein the stiffener frame at least partially surrounds the at least one die. The stiffener may further include at least one resilient member extending from the stiffener frame towards the at least one die, the at least one resilient member including a distal end that extends at a height above the substrate.

The present disclosure also generally relates to a method for forming a semiconductor device. The method may include providing a substrate, coupling at least one die to the substrate, coupling a stiffener to the substrate, wherein the stiffener may include a stiffener frame, wherein the stiffener frame at least partially surrounds the at least one die, and the stiffener further including at least one resilient member extending from the stiffener frame towards the at least one die, and wherein the at least one resilient member may include a distal end that extends at a height above the substrate; and coupling a heat sink to the at least one die by having the heat sink first engage the at least one resilient member near the distal end before coming into contact with the at least one die.

A technical effect or advantage of the present disclosure is the resilient member(s) of the stiffener may now act as a first point of contact during the heat sink installation. As the tip (i.e., a distal end) of the stiffener may be close to an edge of a die, the resilient member(s) of the stiffener absorbs the pressure from the heat sink during the attachment process, thereby greatly reducing the possibility of cracking the die.

Another advantage of the present disclosure is the design of the stiffener may eliminate the concern of rough handling by factory operators during the heat sink installation process.

A further advantage of the present disclosure is the ease of fabricating the stiffener. In one example, the stiffener may be a metal formed by a metal forming process.

To more readily understand and put into practical effect the present disclosure, particular aspects will now be described by way of examples and not limitations, and with reference to the drawings. For the sake of brevity, duplicate descriptions of features and properties may be omitted.

FIG. 1A shows a top view of a semiconductor package according to an aspect of the present disclosure.

FIG. 1B shows a front view of a semiconductor package according to the aspect as shown in FIG. 1A.

As shown in FIG. 1A, the semiconductor package 100 may include a package substrate 102. The package substrate 102 may include a perimeter or footprint. The semiconductor package 100 may also include a stiffener 104. The stiffener 104 may include a perimeter or footprint. The semiconductor package 100 may further include a die 106. The die 106 may include a perimeter or footprint. The footprint of the die 106 may fall within the perimeter of the stiffener 104. The footprints of the die 106 and the stiffener 104 may fall within the footprint of the package substrate 102.

The package substrate 102 may have contact pads, electrical interconnects, routings, and other features, which are not shown in any of the present figures and which are conventional features known to a person skilled in the art. Various couplings of the components may use conventional methods, including solder bonding, thermal compression bonding, or other metal diffusion method.

The die 106 may be disposed on a top surface of the package substrate 102. The die 106 may contact pads, routings, and other features, which are not shown in any of the present figures and which are conventional features known to a person skilled in the art. In other words, the die 106 may be electrically coupled to the package substrate 102. The die 106 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The stiffener 104 may be coupled to the package substrate 102. In one aspect, the stiffener 104 may be disposed on the package substrate via non-electrically conducting means. For example, the stiffener 104 may be connected to the package substrate 102 via a non-conducting adhesive layer (not shown) positioned between the stiffener 104 and the package substrate 102. Suitable stiffener materials may include, but not limited to, aluminum, steel, titanium, copper, silicon carbide, other metal alloy composites, and metal alloy composites with surface treatment.

The stiffener 104 may be positioned around or close to the periphery of the package substrate 102. One advantage of having a stiffener on a package substrate may be to reinforce the structural rigidity of the package substrate to prevent or reduce warpage.

In the aspect shown in FIG. 1A, the stiffener 104 may include a stiffener frame 104a. The stiffener frame 104a may completely surround the die 106. However, the stiffener frame 104a may also partially surround the die 106. For example in a case of a common rectangularly shaped die 106, the stiffener frame 104a may be in a form of a "C" shape, "U" shape, "L" shape, or any other shapes or configuration, when viewed from the top, so long as the footprint of the die 106 falls within the perimeter of the stiffener 104.

The stiffener 104 may further include at least one resilient member (108, 110, 112, 114) extending from the stiffener frame 104a. In the aspect shown in FIG. 1A, the stiffener 104 may include four resilient members (108, 110, 112, 114). Each of the four resilient members (108, 110, 112, 114) may extend from the stiffener frame 104a towards the die 106. As shown in the figure, prior to an assembly of a heat sink or a heat pipe, a distal end of each of the four resilient members (108, 110, 112, 114) may stop close to, but without contacting or touching, the die 106. The distal end of a resilient member may be the end of the resilient member that is farthest away from the stiffener frame 104a.

While the number of resilient members illustrated in FIG. 1A may be four, it is to be understood and appreciated that the number of resilient members extending from the stiffener frame 104a need not be restricted to four. As an example, the stiffener 104 may include two resilient members extending from the stiffener frame 104a towards the die 106. In one aspect, the two resilient members (108, 112) may extend from the stiffener frame 104a towards the die 106 from opposing directions. In another aspect, the two resilient members (108, 114) may extend from the stiffener frame 104a towards the die 106 in different directions. In other aspects, the stiffener 104 may include one resilient member, three resilient members, or more than four resilient members.

In the aspect shown in FIG. 1A, each of the four resilient members (108, 110, 112, 114) may extend equally from the stiffener frame 104a towards the die 106. In other aspects, at least two of the four resilient members (108, 110, 112, 114) may extend at different lengths from the stiffener frame 104a towards the die 106. For example, a distal end of one resilient member may stop closer to the die 106 than a distal end of another resilient member.

FIG. 1B shows the semiconductor package 100 in a front view. In addition to extending from the stiffener frame 104a towards the die 106, each of the four resilient members (108, 110, 112, 114) may also extend above the package substrate 102 such that the distal end of each of the four resilient members (108, 110, 112, 114) may have a height above the surface of the package substrate 102. In the aspect shown in FIG. 1B, each of the four resilient members (108, 110, 112, 114) may extend from the stiffener frame 104a towards the die 106 in equal length and height (and therefore, only resilient members 112, 114 are shown). In other aspects, at least two of the four resilient members (108, 110, 112, 114) may extend from the stiffener frame 104a towards the die 106 in different length and/or height.

Figure 1C:
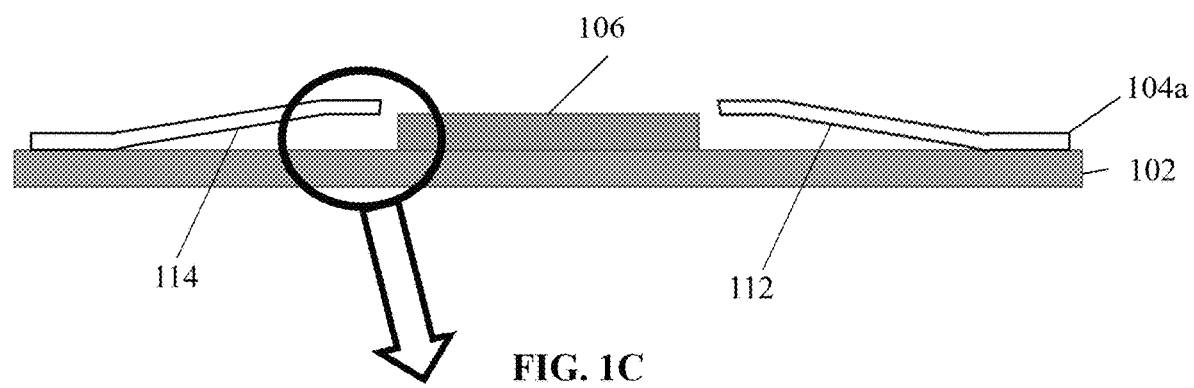
FIG. 1C shows a front view of a semiconductor package according to the aspect as shown in FIG. 1A.

FIG. 1C shows a front view of a semiconductor package according to the aspect as shown in FIG. 1A.

Figure 1D:
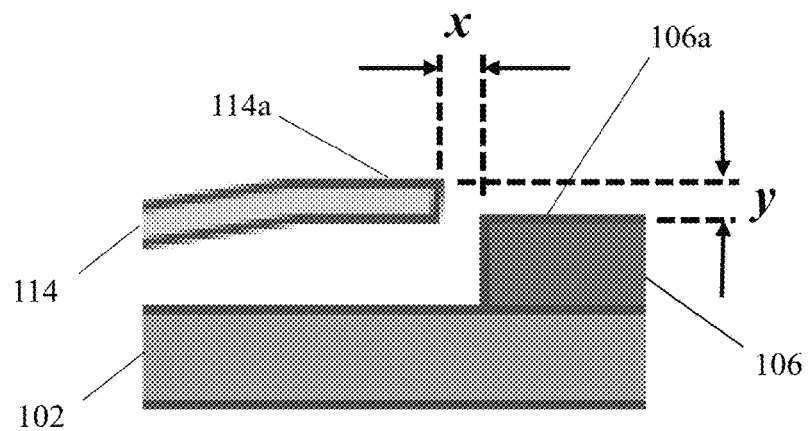
FIG. 1D shows an exploded view of a semiconductor package according to the aspect as shown in FIG. 1C.

FIG. 1D shows an exploded view of a semiconductor package according to the aspect as shown in FIG. 1C. FIG. 1C is almost identical to FIG. 1B.

FIG. 1D shows an exploded view of an area including the distal end of one of the four resilient members 114 and a portion of the die 106. As mentioned above, prior to an assembly of a heat sink or a heat pipe, the distal end of one resilient member 114 may stop close to but without contacting or touching the die 106. After a heat sink or a heat pipe is installed and the four resilient members 114 are deflected downwardly, there may be a gap, clearance, or distance between the distal end of one resilient member 114 and the die 106, and such gap is defined as "x" as illustrated in FIG. 1D. In the aspect shown in FIG. 1D, a minimum "x" distance may be approximately 1 millimeter (mm) after installation of a heat sink or a heat pipe. In another aspect (not shown), the "x" distance may be zero. In other words, when deflected, the resilient members 114 may be in contact with one side of the die 106.

The distal end of one resilient member 114 may have a top surface 114a having a height above the package substrate 102. The die 106 may have a top surface 106a having a height above the package substrate 102. Prior to an assembly of a heat sink or a heat pipe, the height of the top surface 114a of the distal end of one resilient member 114 may be greater than the height of the top surface 106a of the die 106. Before a heat sink or a heat pipe is installed and the four resilient members 114 are deflected downwardly, there may be a height difference defined as "y" as illustrated in FIG. 1D. In the aspect shown in FIG. 1D, a minimum "y" distance may be approximately 1 mm (e.g., "y"=+1 mm) above the top surface 106a of the die 106, before installation of a heat sink or a heat pipe. In another aspect shown in FIG. 1G, the "y" distance may be zero (e.g., "y"=0 mm), i.e., the resilient members 114 may be at the same level as the top surface 106a of the die 106, after installation of a heat sink or heat pipe. When deflected, the resilient members 114 may or may not be in contact with one side of the die 106. In yet another aspect (not shown), a minimum "y" distance of approximately 1 mm (e.g., "y"=−1 mm) below the top surface 106a of the die 106 may still be possible, after installation of a heat sink or a heat pipe.

For brevity, FIG. 1D illustrates the arrangement only for one resilient member 114, and the above discussion may apply to other resilient members (108, 110, 112). In various aspects, all of the four resilient members (108, 110, 112, 114) may have the same gap x and/or the same height difference y. In other aspects, all of the four resilient members (108, 110, 112, 114) may have a different gap x and/or a different height difference y. In yet other aspects, at least two of the resilient members (108, 110, 112, 114) may have the same gap x and/or the same height difference y.

Figure 1E:
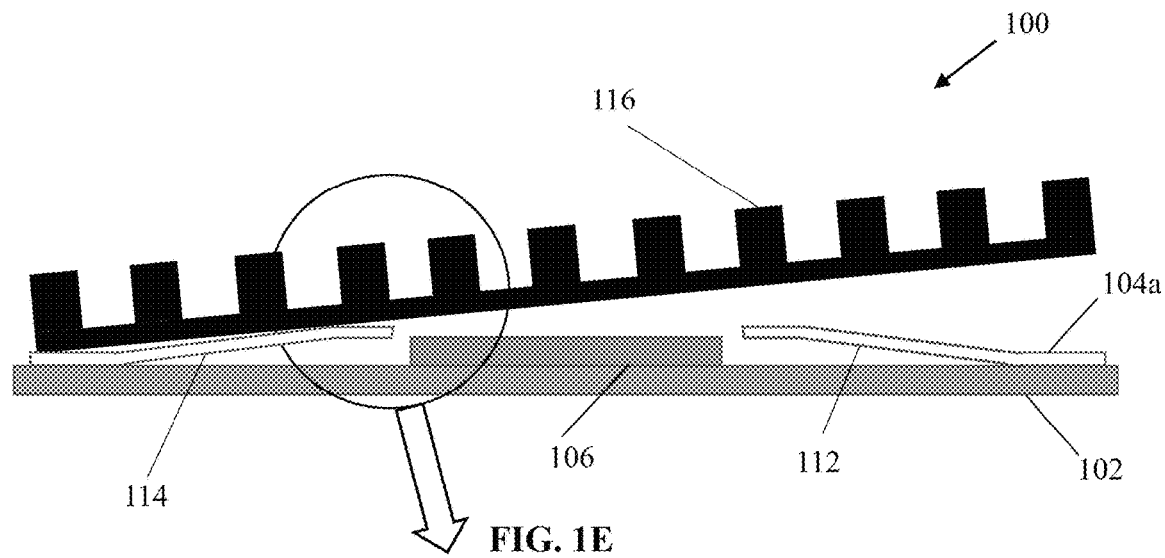
FIG. 1E shows a front view of a semiconductor package according to the aspect as shown in FIG. 1A, during the installation of a heat sink.

FIG. 1E shows a front view (top figure) and an exploded view (bottom figure) of the semiconductor package 100 according to the aspect shown in FIG. 1A, during the installation of a heat sink 116.

In FIG. 1E, during the installation of the heat sink 116, due to the greater height of the distal end of one resilient member 114 than the die 106, the heat sink 116 may be made to contact the resilient member 114 at or near the distal end.

Figure 1F:
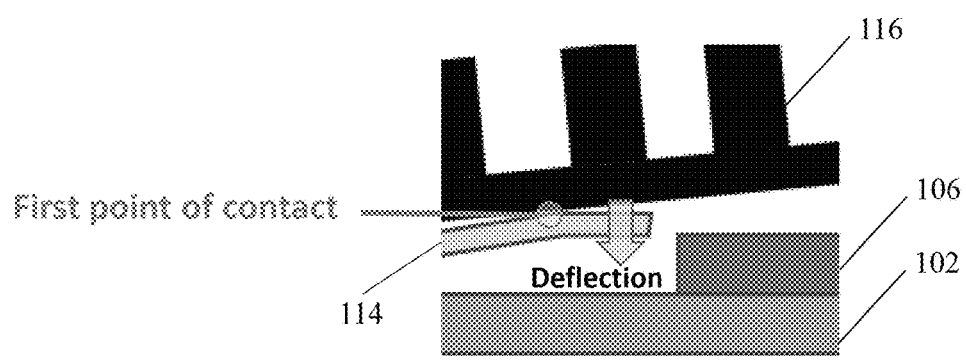
FIG. 1F shows an exploded view of a semiconductor package according to the aspect as shown in FIG. 1E, during the installation of a heat sink.
Figure 1G:
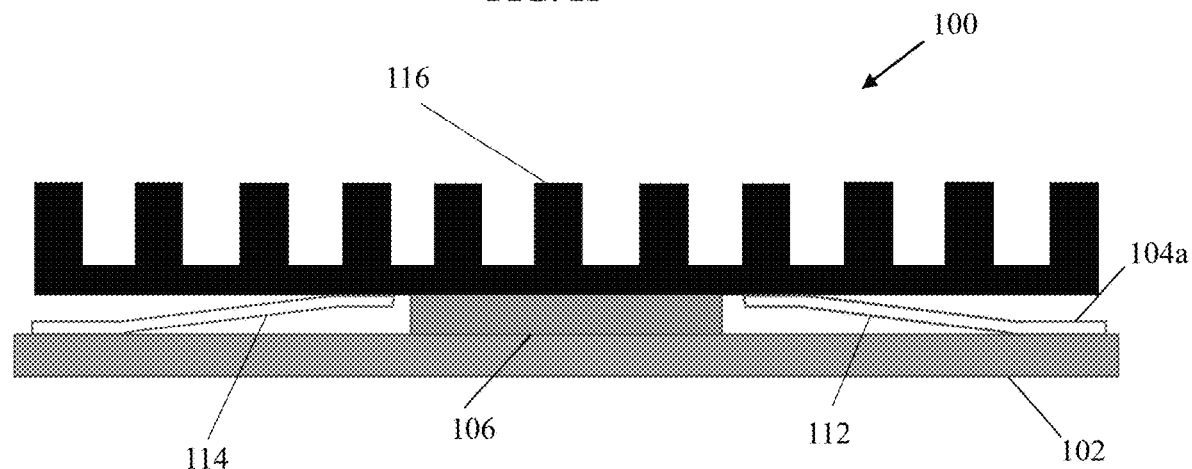
FIG. 1G shows a front view of a semiconductor package according to the aspect as shown in FIG. 1E, after installation of a heat sink.

FIG. 1F shows an exploded view of the area including the distal end of one of the four resilient members 114, a portion of the die 106, and a section of the heat sink 116. As shown in this figure, during the installation of the heat sink 116, a first point of contact may be made on one of the four resilient members 114 instead of on the die 106. Each of the four resilient members (108, 110, 112, 114) may be made of a resilient material. The resilient members (108, 110, 112, 114) may act as a "cushion" to absorb high-pressure load at the die edges during heat sink installation, thereby alleviating the problems of die crack in semiconductor packages.

As mentioned above, the distal ends of the four resilient members (108, 110, 112, 114) should be higher than the surface of the die 106 and some distance away from the die 106. This design may allow the four resilient members (108, 110, 112, 114) to absorb the pressure load during the heat sink assembly and to deflect downward. By having clearance, the distal end of the four resilient members (108, 110, 112, 114) may not contact the die 106, thereby preserving its integrity.

An advantage of providing resilient members is that during the heat sink assembly, the resilient members (108, 110, 112, 114) absorb the pressure load of the heat sink 116 and deflect downwardly, thereby allowing the heat sink 116 to gently contact the top surface of die 106 in a uniform manner. In other words, damage to the die 106 caused by the tilting of the heat sink 116 may be avoided during the assembly.

Likewise, during disassembly, the resiliency of the resilient members (108, 110, 112, 114) may cause the resilient members (108, 110, 112, 114) to flex upwardly when pressure load of the heat sink 116 is reduced or removed, thereby allowing the heat sink 116 to gently lift off from the top surface of the die 106 in a uniform manner. In other words, damage to the die 106 caused by the tilting of the heat sink 116 may be avoided during the disassembly. In such a configuration, the four resilient members (108, 110, 112, 114) may act like a diving board.

FIG. 1F shows a front view of the semiconductor package according to the aspect as shown in FIG. 1E, after installation of the heat sink 116.

In various aspects, one or more of the four resilient members (108, 110, 112, 114) may be formed of suitable materials, such as, but not limited to, aluminum, steel, titanium, copper, silicon carbide, other metal alloy composites, and metal alloy composites with surface treatment.

In various aspects, one or more of the four resilient members (108, 110, 112, 114) may be formed of a same or different material from the stiffener 104. In one aspect, the stiffener 104 and the one or more of the four resilient members (108, 110, 112, 114) may include, for example, aluminum. In another aspect, the stiffener 104 may include, for example, steel while the one or more of the four resilient members (108, 110, 112, 114) may include, for example, aluminum.

One or more of the four resilient members (108, 110, 112, 114) may be made of the same or different material/surface finish as the stiffener 104. Further, one or more of the four resilient members (108, 110, 112, 114) may form an integral part of the stiffener 104. In various aspects, the one or more of the four resilient members (108, 110, 112, 114) may be formed by CNC machining or stamping process.

The resiliency of the four resilient members (108, 110, 112, 114) may be controlled by the type of material, the thickness of the material, the shape or design, and the height above the die 106, according to the amount of load to absorb.

For example, if the four resilient members (108, 110, 112, 114) are made from a hard material (such as steel), then the shape of the four resilient members (108, 110, 112, 114) may be made slimmer (such as in a form of a strip) and smaller thickness. On the other hand, if the four resilient members (108, 110, 112, 114) are made from soft materials (such as aluminum), then the shape of the four resilient members (108, 110, 112, 114) may be made bigger and thicker. In an aspect, the four resilient members (108, 110, 112, 114) may be made of a composite or multilayer of materials.

Figures 2A, 2B:
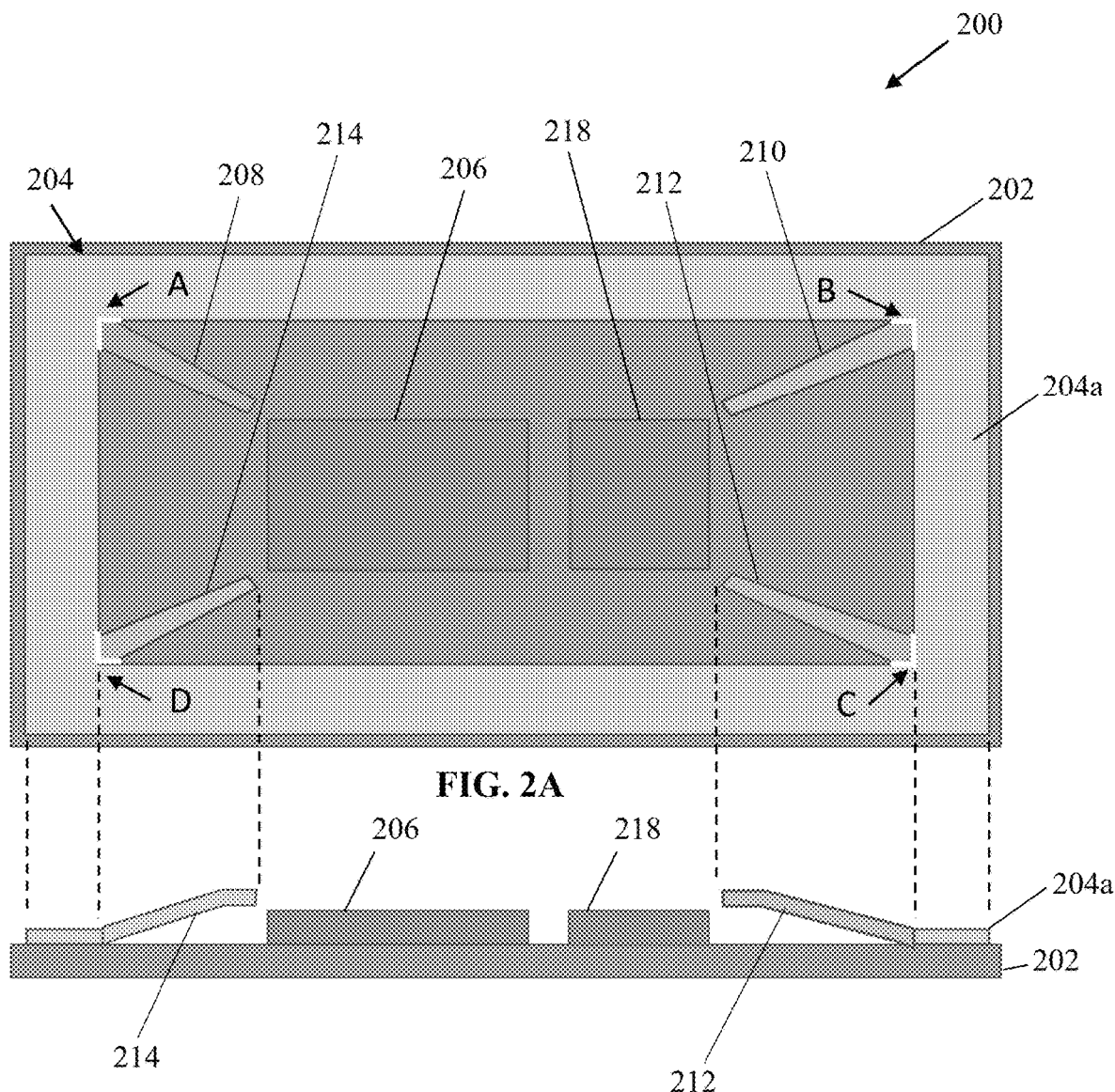
FIG. 2A shows a top view of a semiconductor package according to another aspect of the present disclosure.
FIG. 2B shows a front view of a semiconductor package according to the aspect shown in FIG. 2A.

FIG. 2A shows a top view of a semiconductor package 200 according to another aspect of the present disclosure. FIG. 2B shows a front view of a semiconductor package 200 according to the aspect shown in FIG. 2A. The semiconductor package 200 may be similar to the semiconductor package 100 of FIG. 1A and may include additional variations and components as described below. For example, while the aspect shown in FIG. 1A may be directed to a single die package, the aspect shown in FIG. 2A may be directed to a multi-chip package, i.e., where two or more dies may be coupled to a package substrate.

As shown in FIG. 2A, the semiconductor package 200 may include a package substrate 202. The package substrate 202 may include a perimeter or footprint. The semiconductor package 200 may also include a stiffener 204. The stiffener 204 may include a perimeter or footprint. The semiconductor package 200 may further include a first die 206 and a second die 218. The first die 206 may include a perimeter or footprint. The second die 218 may include a perimeter or footprint. The second die 218 may be positioned adjacent to the first die 206. The footprint of the first die 206 and the footprint of the second die 218 may fall within the perimeter of the stiffener 204. The footprints of the first die 206, the second die 218, and the stiffener 204 may fall within the footprint of the package substrate 202.

The package substrate 202 may have contact pads, electrical interconnects, routings, and other features, which are not shown in any of the present figures and which are conventional features known to a person skilled in the art. Various couplings of the components may use conventional methods, including solder bonding, thermal compression bonding, or other metal diffusion method.

The first die 206 may be disposed on a top surface of the package substrate 202. The first die 206 may contact pads, routings, and other features, which are not shown in any of the present figures and which are conventional features known to a person skilled in the art. In other words, the first die 206 may be electrically coupled to the package substrate 202. The first die 206 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The second die 218 may be disposed on a top surface of the package substrate 202. The second die 218 may contact pads, routings, and other features, which are not shown in any of the present figures and which are conventional features known to a person skilled in the art. In other words, the second die 218 may be electrically coupled to the package substrate 202. The second die 218 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The stiffener 204 may be coupled to the package substrate 202. In one aspect, the stiffener 204 may be disposed on the package substrate via non-electrically conducting means. For example, the stiffener 204 may be connected to the package substrate 202 via a non-conducting adhesive layer (not shown) positioned between the stiffener 204 and the package substrate 202. Suitable stiffener materials may include, but not limited to, aluminum, steel, titanium, copper, silicon carbide, other metal alloy composites, and metal alloy composites with surface treatment.

The stiffener 204 may be positioned around or close to the periphery of the package substrate 202. One advantage of having a stiffener on a package substrate may be to reinforce the structural rigidity of the package substrate to prevent or reduce warpage.

In the aspect shown in FIG. 2A, the stiffener 204 may include a stiffener frame 204a. The stiffener frame 204a may completely surround the first die 206 and the second die 218. However, the stiffener frame 204a may also partially surround the first die 206 and the second die 218. For example in a case where the first die 206 and the second die 218 may be rectangularly shaped, the stiffener frame 204a may be in a form of a "C" shape, "U" shape, "L" shape, or any other shapes or configuration, when viewed from the top, so long as the footprints of the first die 206 and the second die 218 fall within the perimeter of the stiffener 204.

The stiffener 204 may further include at least one resilient member (208, 210, 212, 214) extending from the stiffener frame 204a. In the aspect shown in FIG. 2A, the stiffener 204 may include four resilient members (208, 210, 212, 214). Each of the four resilient members (208, 210, 212, 214) may extend from the stiffener frame 204a towards the first die 206 and the second die 218. As shown in the figure, prior to an assembly of a heat sink or a heat pipe, a respective distal end of two resilient members (208, 214) may stop close to but without contacting or touching the first die 206, while a respective distal end of the other two resilient members (210, 212) may stop close to, but without contacting or touching, the second die 218 The distal end of a resilient member may be the end of the resilient member that is farthest away from the stiffener frame 204a.

While the number of resilient members illustrated in FIG. 2A may be four, it is to be understood and appreciated that the number of resilient members extending from the stiffener frame 204a need not be restricted to four. As an example, the stiffener 204 may include two resilient members extending from the stiffener frame 204a towards the first die 206 and the second die 218. In one aspect, the two resilient members (208, 212) may extend from the stiffener frame 204a towards the first die 206 and the second die 218 from opposing directions. In another aspect, the two resilient members (208, 214) may extend from the stiffener frame 204a towards the first die 206 in different directions. In other aspects, the stiffener 204 may include one resilient member, three resilient members, or more than four resilient members.

In the aspect shown in FIG. 2A, each of the four resilient members (208, 210, 212, 214) may extend equally from the stiffener frame 204a towards the first die 206 and the second die 218. In other aspects, at least two of the four resilient members (208, 210, 212, 214) may extend at different lengths from the stiffener frame 204a towards the first die 206 and the second die 218. For example, a distal end of one resilient member may stop closer to the first die 206 while a distal end of another resilient member may stop farther away from the second die 218. Put it in another way, there may be a gap, clearance, or distance between the distal end of one resilient member 208 and the first die 206, between the distal end of one resilient member 214 and the first die 206, between the distal end of one resilient member 210 and the second die 218, and between the distal end of one resilient member 212 and the second die 218.

FIG. 2B shows the semiconductor package 200 in a front view. In addition to extending from the stiffener frame 204a towards the first die 206 and the second die 218, each of the four resilient members (208, 210, 212, 214) may also extend above the package substrate 202 such that the distal end of each of the four resilient members (208, 210, 212, 214) may have a height above the package substrate 202. In the aspect shown in FIG. 2B, each of the four resilient members (208, 210, 212, 214) may extend from the stiffener frame 204a towards the first die 206 and the second die 218 in equal length and height (and therefore, only resilient members 212, 214 are shown). In other aspects, at least two of the four resilient members (208, 210, 212, 214) may extend from the stiffener frame 204a towards the first die 206 and the second die 218 in different length and/or height.

In various aspects, one or more of the four resilient members (208, 210, 212, 214) may be formed of suitable materials, such as, but not limited to, aluminum, steel, titanium, copper, silicon carbide, other metal alloy composites, and metal alloy composites with surface treatment.

In various aspects, one or more of the four resilient members (208, 210, 212, 214) may be formed of a same or different material from the stiffener 204. In one aspect, the stiffener 204 and the one or more of the four resilient members (208, 210, 212, 214) may include, for example, aluminum. In another aspect, the stiffener 204 may include, for example, steel while the one or more of the four resilient members (108, 110, 112, 114) may include, for example, aluminum.

One or more of the four resilient members (208, 210, 212, 214) may be made of the same or different material/surface finish as the stiffener 204. Further, one or more of the four resilient members (208, 210, 212, 214) may be individual pieces and are attached or secured to the stiffener 204. In various aspects, the one or more of the four resilient members (208, 210, 212, 214) may be soldered, welded, or mechanically screwed onto the stiffener 204 at points marked "A", "B", "C", and "D", as shown in FIG. 2A.

FIG. 3A shows a top view of a semiconductor package 300 according to another aspect of the present disclosure. FIG. 3B shows a front view of a semiconductor package according to the aspect shown in FIG. 3A. FIG. 3C shows a side view of a semiconductor package according to the aspect shown in FIG. 3A. The semiconductor package 300 may be similar to the semiconductor package 100 of FIG. 1A and may include additional variations and components as described below. For example, FIG. 3A shows a different configuration of the resilient members extending from the stiffener frame.

In the aspect shown in FIG. 3A, the semiconductor package 300 may include a package substrate 302. The package substrate 302 may include a perimeter or footprint. The semiconductor package 300 may also include a stiffener 304. The stiffener 304 may include a perimeter or footprint. The semiconductor package 300 may further include a die 306. The die 306 may include a perimeter or footprint. The footprint of the die 306 may fall within the perimeter of the stiffener 304. The footprints of the die 306 and the stiffener 304 may fall within the footprint of the package substrate 302.

The package substrate 302 may have contact pads, electrical interconnects, routings, and other features, which are not shown in any of the present figures and which are conventional features known to a person skilled in the art. Various couplings of the components may use conventional methods, including solder bonding, thermal compression bonding, or other metal diffusion method.

The die 306 may be disposed on a top surface of the package substrate 302. The die 306 may contact pads, routings, and other features, which are not shown in any of the present figures and which are conventional features known to a person skilled in the art. In other words, the die 306 may be electrically coupled to the package substrate 302. The die 306 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The stiffener 304 may be coupled to the package substrate 302. In one aspect, the stiffener 304 may be disposed on the package substrate via non-electrically conducting means. For example, the stiffener 304 may be connected to the package substrate 302 via a non-conducting adhesive layer (not shown) positioned between the stiffener 304 and the package substrate 302. Suitable stiffener materials may include, but not limited to, aluminum, steel, titanium, copper, silicon carbide, other metal alloy composites, and metal alloy composites with surface treatment.

The stiffener 304 may be positioned around or close to the periphery of the package substrate 302. One advantage of having a stiffener on a package substrate may be to reinforce the structural rigidity of the package substrate to prevent or reduce warpage.

In the aspect shown in FIG. 3A, the stiffener 304 include a stiffener frame 304a. The stiffener frame 304a may completely surround the die 306. However, the stiffener frame 304a may also partially surround the die 306. For example in a case of a common rectangularly shaped die 306, the stiffener frame 304a may be in a form of a "C" shape, "U" shape, "L" shape, or any other shapes or configuration, when viewed from the top, so long as the footprint of the die 306 falls within the perimeter of the stiffener 304.

The stiffener 304 may further include at least one resilient member (308, 312) extending from the stiffener frame 304a. In the aspect shown in FIG. 3A, the stiffener 304 may include two resilient members (308, 312). Each of the two resilient members (308, 312) may extend from the stiffener frame 304a towards the die 306.

As shown in the figure, each of the two resilient members (308, 312) may include a trapezium shape having two parallel sides, when viewed from the top. One resilient member 308 may have a side welded, for example, along an inner side marked "A" of the stiffener frame 304a. A distal side of the resilient member 308 may stop close to but without contacting or touching the die 306. The other resilient member 312 may have a side welded, for example, along another opposing inner side marked "B" of the stiffener frame 304a. A distal side of the other resilient member 312 may stop close to, but without contacting or touching, the die 306.

FIG. 3C shows the semiconductor package 300 in a side view. In addition to extending from the stiffener frame 304a towards the die 306, each of the two resilient members (308, 312) may also extend above the package substrate 302 such that the distal end of each of the two resilient members (308, 312) may have a height above the package substrate 302. In the aspect shown in FIG. 3C, each of the two resilient members (308, 312) may extend from the stiffener frame 304a towards the die 306 in equal length and height. In other aspects, the two resilient members (308, 312) may extend from the stiffener frame 304a towards the die 306 in different length and/or height.

FIG. 3B shows the semiconductor package 300 in a front view. In this view, the die 306 may be hidden behind the resilient member 312, shown in a dashed line.

FIG. 4A shows a top view of a semiconductor package 400 according to another aspect of the present disclosure. FIG. 4B shows a front view of a semiconductor package according to the aspect shown in FIG. 4A. FIG. 4C shows a side view of a semiconductor package according to the aspect shown in FIG. 4A. The semiconductor package 400 may be similar to the semiconductor package 300 of FIG. 3A and may include additional variations and components as described below. For example, while the aspect shown in FIG. 3A may be directed to a single die package, the aspect shown in FIG. 4A may be directed to a multi-chip package, i.e., where two or more dies may be coupled to a package substrate.

As shown in FIG. 4A, the semiconductor package 400 may include a package substrate 402. The package substrate 402 may include a perimeter or footprint. The semiconductor package 400 may also include a stiffener 404. The stiffener 404 may include a perimeter or footprint. The semiconductor package 400 may further include a first die 406 and a second die 418. The first die 406 may include a perimeter or footprint. The second die 418 may include a perimeter or footprint. The second die 418 may be positioned adjacent to the first die 406. The footprint of the first die 406 and the footprint of the second die 418 may fall within the perimeter of the stiffener 404. The footprints of the first die 406, the second die 418, and the stiffener 404 may fall within the footprint of the package substrate 402.

The package substrate 402 may have contact pads, electrical interconnects, routings, and other features, which are not shown in any of the present figures and which are conventional features known to a person skilled in the art. Various couplings of the components may use conventional methods, including solder bonding, thermal compression bonding, or other metal diffusion method.

The first die 406 may be disposed on a top surface of the package substrate 402. The first die 406 may contact pads, routings, and other features, which are not shown in any of the present figures and which are conventional features known to a person skilled in the art. In other words, the first die 406 may be electrically coupled to the package substrate 402.

The first die 406 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The second die 418 may be disposed on a top surface of the package substrate 402. The second die 418 may contact pads, routings, and other features, which are not shown in any of the present figures and which are conventional features known to a person skilled in the art. In other words, the second die 418 may be electrically coupled to the package substrate 402. The second die 418 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The stiffener 404 may be coupled to the package substrate 402. In one aspect, the stiffener 404 may be disposed on the package substrate via non-electrically conducting means. For example, the stiffener 404 may be connected to the package substrate 402 via a non-conducting adhesive layer (not shown) positioned between the stiffener 404 and the package substrate 402. Suitable stiffener materials may include, but not limited to, aluminum, steel, titanium, copper, silicon carbide, other metal alloy composites, and metal alloy composites with surface treatment.

The stiffener 404 may be positioned around or close to the periphery of the package substrate 402. One advantage of having a stiffener on a package substrate may be to reinforce the structural rigidity of the package substrate to prevent or reduce warpage.

In the aspect shown in FIG. 4A, the stiffener 404 may include a stiffener frame 404a. The stiffener frame 404a may completely surround the first die 406 and the second die 418. However, the stiffener frame 404a may also partially surround the first die 406 and the second die 418. For example in a case where the first die 406 and the second die 418 may be rectangularly shaped, the stiffener frame 404a may be in a form of a "C" shape, "U" shape, "L" shape, or any other shapes or configuration, when viewed from the top, so long as the footprints of the first die 406 and the second die 418 fall within the perimeter of the stiffener 404.

The stiffener 404 may further include at least one resilient member (408, 412) extending from the stiffener frame 404a. In the aspect shown in FIG. 4A, the stiffener 404 may include two resilient members (408, 412). Each of the two resilient members (408, 412) may extend from the stiffener frame 404a towards the first die 406 and the second die 418.

As shown in the figure, each of the two resilient members (408, 412) may include a trapezium shape having two parallel sides, when viewed from the top. One resilient member 408 may have a side welded, for example, along an inner side marked "A" of the frame stiffener 404a. A distal side of the resilient member 408 may stop close to, but without contacting or touching, the first die 406 and the second die 418. Another resilient member 412 may have a side welded, for example, along another opposing inner side marked "B" of the stiffener frame 404a. A distal side of the another resilient member 412 may stop close to but without contacting or touching the first die 406 and the second die 418.

FIG. 4C shows the semiconductor package 400 in a side view. In addition to extending from the stiffener frame 404a towards the first die 406 and the second die 418, each of the two resilient members (408, 412) may also extend above the package substrate 402 such that the distal end of each of the two resilient members (408, 412) may have a height above the package substrate 402. In the aspect shown in FIG. 4C, each of the two resilient members (408, 412) may extend from the stiffener frame 404a towards the first die 406 and the second die 418 in equal length and height. In other aspects, the two resilient members (408, 412) may extend from the stiffener frame 404a towards the first die 406 and the second die 418 in different length and/or height.

FIG. 4B shows the semiconductor package 400 in a front view. In this view, the first die 406 and the second die 418 may be hidden behind the resilient member 412, shown in dashed lines.

Figures 5A, 5B:
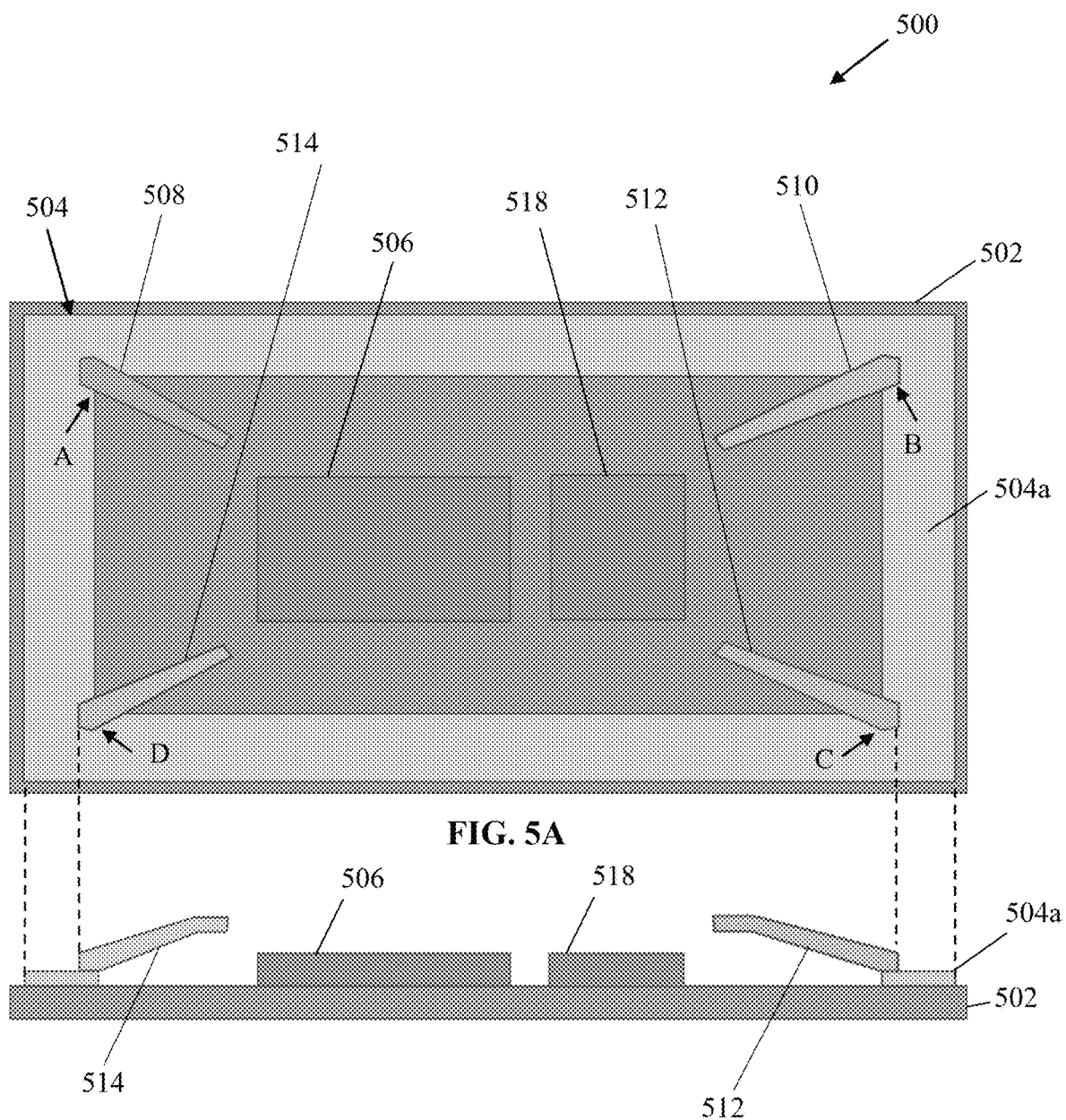
FIG. 5A shows a top view of a semiconductor package according to another aspect of the present disclosure.
FIG. 5B shows a front view of a semiconductor package according to the aspect shown in FIG. 5A.

FIG. 5A shows a top view of a semiconductor package 500 according to another aspect of the present disclosure. FIG. 5B shows a front view of a semiconductor package 500 according to the aspect shown in FIG. 5A. The semiconductor package 500 may be similar to the semiconductor package 200 of FIG. 2A and may include additional variations and components as described below. For example, FIG. 5A shows a different configuration of the resilient members extending from the stiffener frame.

As shown in FIG. 5A, the semiconductor package 500 may include a package substrate 502. The package substrate 502 may include a perimeter or footprint. The semiconductor package 500 may also include a stiffener 504. The stiffener 504 may include a perimeter or footprint. The semiconductor package 500 may further include a first die 506 and a second die 518. The first die 506 may include a perimeter or footprint. The second die 518 may include a perimeter or footprint. The second die 518 may be positioned adjacent to the first die 506. The footprint of the first die 506 and the footprint of the second die 518 may fall within the perimeter of the stiffener 504. The footprints of the first die 506, the second die 518, and the stiffener 504 may fall within the footprint of the package substrate 502.

The package substrate 502 may have contact pads, electrical interconnects, routings, and other features, which are not shown in any of the present figures and which are conventional features known to a person skilled in the art. Various couplings of the components may use conventional methods, including solder bonding, thermal compression bonding, or other metal diffusion method.

The first die 506 may be disposed on a top surface of the package substrate 502. The first die 506 may contact pads, routings, and other features, which are not shown in any of the present figures and which are conventional features known to a person skilled in the art. In other words, the first die 506 may be electrically coupled to the package substrate 502. The first die 506 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The second die 518 may be disposed on a top surface of the package substrate 502. The second die 518 may contact pads, routings, and other features, which are not shown in any of the present figures and which are conventional features known to a person skilled in the art. In other words, the second die 518 may be electrically coupled to the package substrate 502. The second die 518 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The stiffener 504 may be coupled to the package substrate 502. In one aspect, the stiffener 504 may be disposed on the package substrate via non-electrically conducting means. For example, the stiffener 504 may be connected to the package substrate 502 via a non-conducting adhesive layer (not shown) positioned between the stiffener 504 and the package substrate 502. Suitable stiffener materials may include, but not limited to, aluminum, steel, titanium, copper, silicon carbide, other metal alloy composites, and metal alloy composites with surface treatment.

The stiffener 504 may be positioned around or close to the periphery of the package substrate 502. One advantage of having a stiffener on a package substrate may be to reinforce the structural rigidity of the package substrate to prevent or reduce warpage.

In the aspect shown in FIG. 5A, the stiffener 504 may include a stiffener frame 504a. The stiffener frame 504a may completely surround the first die 506 and the second die 518. However, the stiffener frame 504a may also partially surround the first die 506 and the second die 518. For example in a case where the first die 506 and the second die 518 may be rectangularly shaped, the stiffener frame 504a may be in a form of a "C" shape, "U" shape, "L" shape, or any other shapes or configuration, when viewed from the top, so long as the footprints of the first die 506 and the second die 518 fall within the perimeter of the stiffener 504.

The stiffener 504 may further include at least one resilient member (508, 510, 512, 514) extending from the stiffener frame 504a. In the aspect shown in FIG. 5A, the stiffener 504 may include four resilient members (508, 510, 512, 514). Each of the four resilient members (508, 510, 512, 514) may extend from the stiffener frame 504a towards the first die 506 and the second die 518. As shown in the figure, a respective distal end of two resilient members (508, 514) may stop close to but without contacting or touching the first die 506, while a respective distal end of the other two resilient members (510, 512) may stop close to but without contacting or touching the second die 518 The distal end of a resilient member may be the end of the resilient member that is farthest away from the stiffener frame 504a.

While the number of resilient members illustrated in FIG. 5A may be four, it is to be understood and appreciated that the number of resilient members extending from the stiffener frame 504a need not be restricted to four. As an example, the stiffener 504 may include two resilient members extending from the stiffener frame 504a towards the first die 506 and the second die 518. In one aspect, the two resilient members (508, 512) may extend from the stiffener frame 504a towards the first die 506, and the second die 518 from opposing directions. In another aspect, the two resilient members (508, 514) may extend from the stiffener frame 504a towards the first die 506 in different directions. In other aspects, the stiffener 504 may include one resilient member, three resilient members, or more than four resilient members.

In the aspect shown in FIG. 5A, each of the four resilient members (508, 510, 512, 514) may extend equally from the stiffener frame 504a towards the first die 506 and the second die 518. In other aspects, at least two of the four resilient members (508, 510, 512, 514) may extend at different lengths from the stiffener frame 504a towards the first die 506 and the second die 518. For example, a distal end of one resilient member may stop closer to the first die 506 while a distal end of another resilient member may stop farther away from the second die 518. Put it in another way, there may be a gap, clearance, or distance between the distal end of one resilient member 508 and the first die 506, between the distal end of one resilient member 514 and the first die 506, between the distal end of one resilient member 510 and the second die 518, and between the distal end of one resilient member 512 and the second die 518.

FIG. 5B shows the semiconductor package 500 in a front view. In addition to extending from the stiffener frame 504a towards the first die 506 and the second die 518, each of the four resilient members (508, 510, 512, 514) may also extend above the package substrate 502 such that the distal end of each of the four resilient members (508, 510, 512, 514) may have a height above the package substrate 502. In the aspect shown in FIG. 5B, each of the four resilient members (508, 510, 512, 514) may extend from the stiffener frame 504*a* towards the first die 506 and the second die 518 in equal length and height (and therefore, only resilient members 512, 514 are shown). In other aspects, at least two of the four resilient members (508, 510, 512, 514) may extend from the stiffener frame 504*a* towards the first die 506 and the second die 518 in different length and/or height.

One or more of the four resilient members (508, 510, 512, 514) may be made of the same or different material/surface finish as the stiffener 504. Further, one or more of the four resilient members (508, 510, 512, 514) may be individual pieces and are attached or secured to a top surface of the stiffener 504. In various aspects, the one or more of the four resilient members (508, 510, 512, 514) may be soldered, welded, or mechanically screwed on top of the stiffener frame 504*a* at points marked "A", "B", "C", and "D", as shown in FIG. 5A.

Figures 6A, 6B:
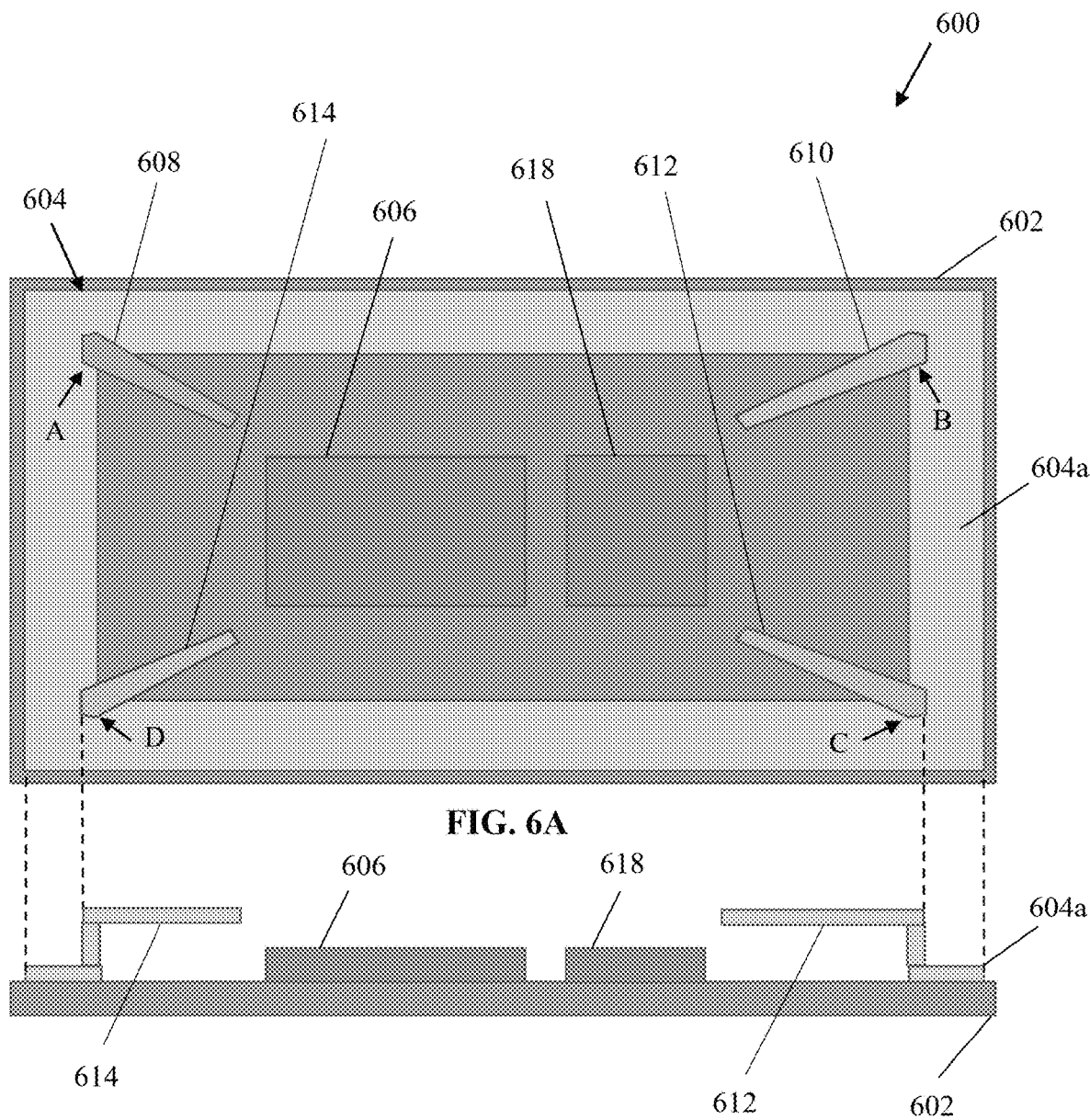
FIG. 6A shows a top view of a semiconductor package according to another aspect of the present disclosure.
FIG. 6B shows a front view of a semiconductor package according to the aspect shown in FIG. 6A.

FIG. 6A shows a top view of a semiconductor package 600 according to another aspect of the present disclosure. FIG. 6B shows a front view of a semiconductor package 600 according to the aspect shown in FIG. 6A. The semiconductor package 600 may be similar to the semiconductor package 200 of FIG. 2A and may include additional variations and components as described below. For example, FIG. 6A shows a different configuration of the resilient members extending from the stiffener.

As shown in FIG. 6A, the semiconductor package 600 may include a package substrate 602. The package substrate 602 may include a perimeter or footprint. The semiconductor package 600 may also include a stiffener 604. The stiffener 604 may include a perimeter or footprint. The semiconductor package 600 may further include a first die 606 and a second die 618. The first die 606 may include a perimeter or footprint. The second die 618 may include a perimeter or footprint. The second die 618 may be positioned adjacent to the first die 606. The footprint of the first die 606 and the footprint of the second die 618 may fall within the perimeter of the stiffener 604. The footprints of the first die 606, the second die 618, and the stiffener 604 may fall within the footprint of the package substrate 602.

The package substrate 602 may have contact pads, electrical interconnects, routings, and other features, which are not shown in any of the present figures and which are conventional features known to a person skilled in the art. Various couplings of the components may use conventional methods, including solder bonding, thermal compression bonding, or other metal diffusion method.

The first die 606 may be disposed on a top surface of the package substrate 602. The first die 606 may contact pads, routings, and other features, which are not shown in any of the present figures and which are conventional features known to a person skilled in the art. In other words, the first die 606 may be electrically coupled to the package substrate 602. The first die 606 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The second die 618 may be disposed on a top surface of the package substrate 602. The second die 618 may contact pads, routings, and other features, which are not shown in any of the present figures and which are conventional features known to a person skilled in the art. In other words, the second die 618 may be electrically coupled to the package substrate 602. The second die 618 may include, but not limited to, a central processing unit (CPU), another processor device or an application specific integrated circuit (ASIC) processor, a memory device, a graphic processing unit (GPU), a sensor device, a platform controller hub (PCH) chipset, a field programmable gate array (FPGA), or an input-output (I/O) tile e.g., a serializer/deserializer (SerDes) tile.

The stiffener 604 may be coupled to the package substrate 602. In one aspect, the stiffener 604 may be disposed on the package substrate via non-electrically conducting means. For example, the stiffener 604 may be connected to the package substrate 602 via a non-conducting adhesive layer (not shown) positioned between the stiffener 604 and the package substrate 602. Suitable stiffener materials may include, but not limited to, aluminum, steel, titanium, copper, silicon carbide, other metal alloy composites, and metal alloy composites with surface treatment.

The stiffener 604 may be positioned around or close to the periphery of the package substrate 602. One advantage of having a stiffener on a package substrate may be to reinforce the structural rigidity of the package substrate to prevent or reduce warpage.

In the aspect shown in FIG. 6A, the stiffener 604 may include a stiffener frame 604*a*. The stiffener frame 604*a* may completely surround the first die 606 and the second die 618. However, the stiffener frame 604*a* may also partially surround the first die 606 and the second die 618. For example in a case where the first die 606 and the second die 618 may be rectangularly shaped, the stiffener frame 604*a* may be in a form of a "C" shape, "U" shape, "L" shape, or any other shapes or configuration, when viewed from the top, so long as the footprints of the first die 606 and the second die 618 fall within the perimeter of the stiffener 604.

The stiffener 604 may further include at least one resilient member (608, 610, 612, 614) extending from the stiffener frame 604*a*. In the aspect shown in FIG. 6A, the stiffener 604 may include four resilient members (608, 610, 612, 614). Each of the four resilient members (608, 610, 612, 614) may extend from the stiffener frame 604*a* towards the first die 606, and the second die 618. As shown in the figure, a respective distal end of two resilient members (608, 614) may stop close to, but without contacting or touching, the first die 606, while a respective distal end of the other two resilient members (610, 612) may stop close to, but without contacting or touching, the second die 618 The distal end of a resilient member may be the end of the resilient member that is farthest away from the stiffener frame 604*a*.

While the number of resilient members illustrated in FIG. 6A may be four, it is to be understood and appreciated that the number of resilient members extending from the stiffener frame 604*a* need not be restricted to four. As an example, the stiffener 604 may include two resilient members extending from the stiffener frame 604*a* towards the first die 606 and the second die 618. In one aspect, the two resilient members (608, 612) may extend from the stiffener frame 604*a* towards the first die 606, and the second die 618 from opposing directions. In another aspect, the two resilient members (608, 614) may extend from the stiffener frame 604*a* towards the first die 606 in different directions. In other aspects, the stiffener 604 may include one resilient member, three resilient members, or more than four resilient members.

In the aspect shown in FIG. 6A, each of the four resilient members (608, 610, 612, 614) may extend equally from the stiffener frame 604a towards the first die 606 and the second die 618. In other aspects, at least two of the four resilient members (608, 610, 612, 614) may extend at different lengths from the stiffener frame 604a towards the first die 606 and the second die 618. For example, a distal end of one resilient member may stop closer to the first die 606 while a distal end of another resilient member may stop farther away from the second die 618. Put it in another way, there may be a gap, clearance, or distance between the distal end of one resilient member 608 and the first die 606, between the distal end of one resilient member 614 and the first die 606, between the distal end of one resilient member 610 and the second die 618, and between the distal end of one resilient member 612 and the second die 618.

FIG. 6B shows the semiconductor package 600 in a front view. In addition to extending from the stiffener frame 604a towards the first die 606 and the second die 618, each of the four resilient members (608, 610, 612, 614) may also extend above the package substrate 602 such that the distal end of each of the four resilient members (608, 610, 612, 614) may have a height above the package substrate 602. In the aspect shown in FIG. 6B, each of the four resilient members (608, 610, 612, 614) may extend from the stiffener frame 604a towards the first die 606 and the second die 618 in equal length and height (and therefore, only resilient members 612, 614 are shown). In other aspects, at least two of the four resilient members (608, 610, 612, 614) may extend from the stiffener frame 604a towards the first die 606 and the second die 618 in different length and/or height.

One or more of the four resilient members (608, 610, 612, 614) may be made of the same or different material/surface finish as the stiffener 606. Further, one or more of the four resilient members (608, 610, 612, 614) may be individual pieces and are attached or secured to a top surface of the stiffener frame 604a. In various aspects, the one or more of the four resilient members (608, 610, 612, 614) may be soldered, welded, or mechanically screwed on top of the stiffener frame 604a at points marked "A", "B", "C", and "D", as shown in FIG. 6A. In the aspect shown in FIG. 6B, the four resilient members (608, 610, 612, 614) may include a cantilever beam configuration and may extend from the stiffener frame 604a towards the first die 606 and the second die 618.

Figure 7:
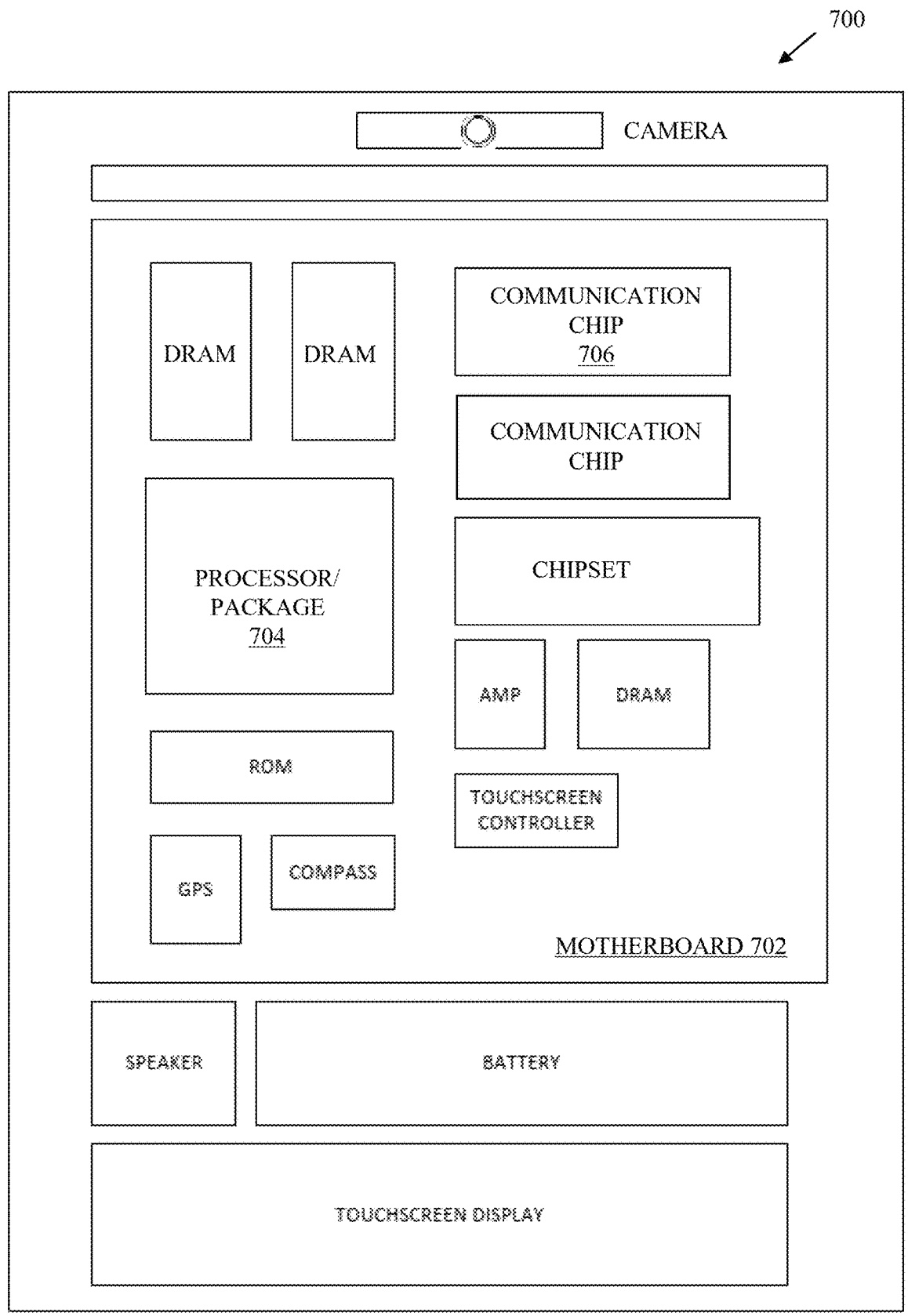
FIG. 7 shows an illustration of a computing device that includes a semiconductor package according to a further aspect of the present disclosure.

Aspects of the present disclosure may be implemented into a system using any suitable hardware and/or software. FIG. 7 schematically illustrates a computing device 700 that may include a semiconductor package as described herein, in accordance with some aspects. The computing device 700 may house a board such as a motherboard 702. The motherboard 702 may include a number of components, including but not limited to a processor 704 and at least one communication chip 706. The processor 704, which may have a semiconductor package according to the present disclosure, may be physically and electrically coupled to the motherboard 702. In some implementations, the at least one communication chip 706 may also be physically and electrically coupled to the motherboard 702. In further implementations, the communication chip 706 may be part of the processor or package 704.

Depending on its applications, computing device 700 may include other components that may or may not be physically and electrically coupled to the motherboard 702. These other components may include, but are not limited to, volatile memory (e.g. DRAM), non-volatile memory (e.g. ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 704 of the computing device 700 may be packaged in a semiconductor package as described herein, and/or other semiconductor devices may be packaged together in a semiconductor package as described herein.

The communication chip 706 may enable wireless communications for the transfer of data to and from the computing device 700. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 406 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 706 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other aspects.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 700 may be a mobile computing device. In further implementations, the computing device 700 may be any other electronic device that processes data.

Figure 8:
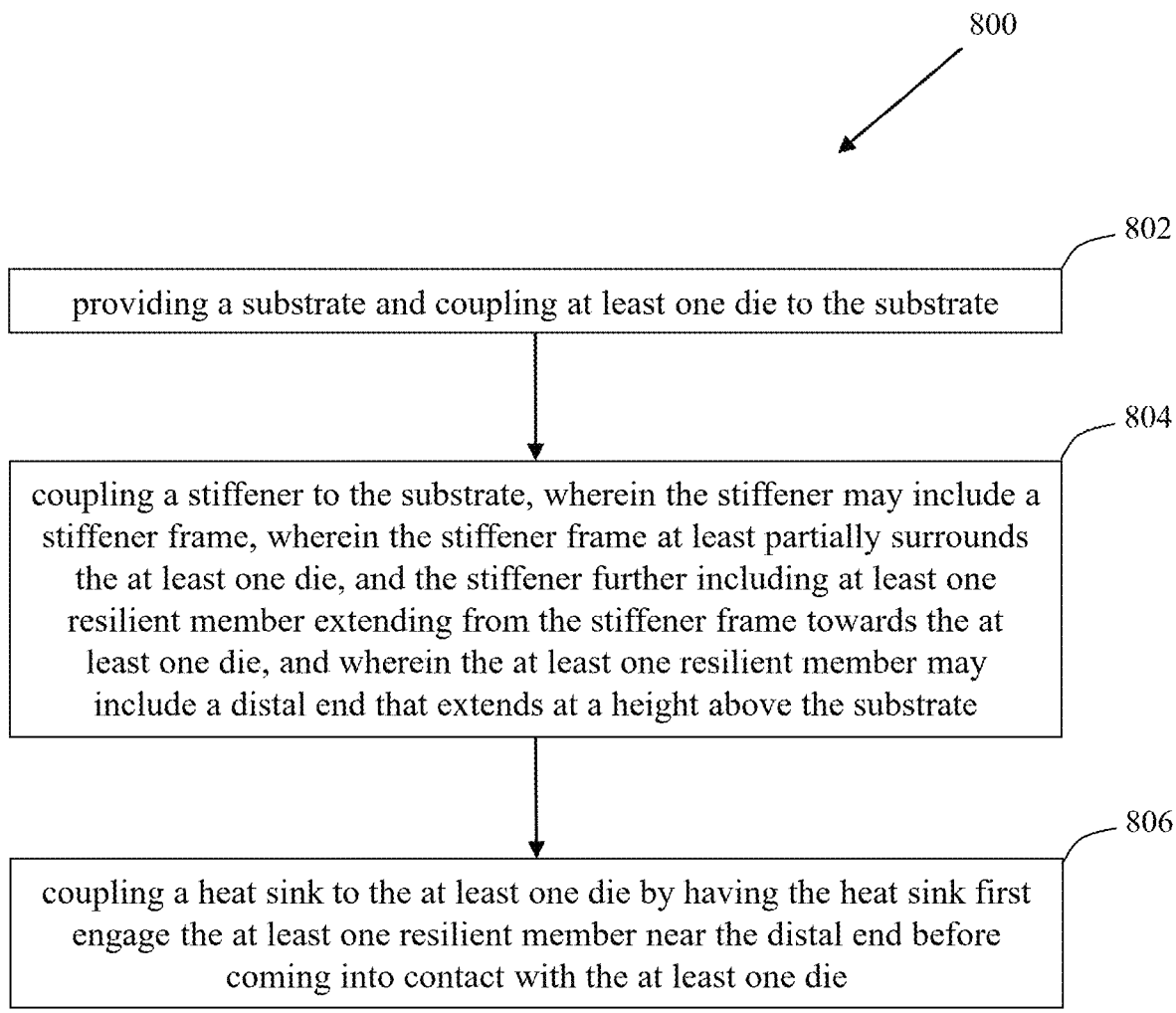
FIG. 8 shows a flow chart illustrating a method for forming a semiconductor package according to an aspect of the present disclosure.

FIG. 8 shows a flow chart illustrating a method 800 of forming a semiconductor package according to an aspect of the present disclosure.

As shown in FIG. 8, at operation 802, the method 800 of forming a semiconductor package may include providing a substrate and coupling at least one die to the substrate. At operation 804, the method may include coupling a stiffener to the substrate, wherein the stiffener may include a stiffener frame, wherein the stiffener frame at least partially surrounds the at least one die, and the stiffener further including at least one resilient member extending from the stiffener frame towards the at least one die, and wherein the at least one resilient member may include a distal end that extends at a height above the substrate. At operation 806, the method may include coupling a heat sink to the at least one die by having the heat sink first engage the at least one resilient member near the distal end before coming into contact with the at least one die.

It will be understood that the above operations described above relating to FIG. 8 are not limited to this particular order. Any suitable, modified order of operations may be used.

EXAMPLES

Example 1 may include a semiconductor package including a substrate; at least one die coupled to the substrate; a stiffener coupled to the substrate, wherein the stiffener includes a stiffener frame, wherein the stiffener frame at least partially surrounds the at least one die; the stiffener further including at least one resilient member extending from the stiffener frame towards the at least one die; and the at least one resilient member including a distal end that extends at a height above the substrate.

Example 2 may include the semiconductor package of example 1 and/or any other example disclosed herein, wherein the distal end of the at least one resilient member is spaced apart from the at least one die, prior to an assembly of a heat sink or heat pipe.

Example 3 may include the semiconductor package of example 1 and/or any other example disclosed herein, wherein the height of the distal end of the at least one resilient member is greater than a height of the at least one die, prior to an assembly of a heat sink or heat pipe.

Example 4 may include the semiconductor package of example 1 and/or any other example disclosed herein, wherein the distal end of the at least one resilient member is spaced apart from the at least one die, or the distal end of the at least one resilient member is in contact with one side of the at least one die, after an assembly of a heat sink or heat pipe.

Example 5 may include the semiconductor package of example 1 and/or any other example disclosed herein, wherein the at least one resilient member further includes two resilient members extending from the stiffener frame towards the at least one die, each of the two resilient members including a distal end that extends at a height above the substrate, prior to an assembly of a heat sink or heat pipe.

Example 6 may include the semiconductor package of example 5 and/or any other example disclosed herein, wherein the distal end of each of the two resilient members has a height above the substrate that is the same, prior to an assembly of a heat sink or heat pipe.

Example 7 may include the semiconductor package of example 5 and/or any other example disclosed herein, wherein each of the two resilient members has a distal end that extends at a different height above the substrate, prior to an assembly of a heat sink or heat pipe.

Example 8 may include the semiconductor package of example 5 and/or any other example disclosed herein, wherein the two resilient members extends towards the at least one die from opposing directions.

Example 9 may include the semiconductor package of example 5 and/or any other example disclosed herein, wherein the two resilient members extends towards the at least one die from the same direction.

Example 10 may include the semiconductor package of example 1 and/or any other example disclosed herein, wherein the at least one resilient member forms an integral part of the stiffener frame.

Example 11 may include the semiconductor package of example 1 and/or any other example disclosed herein, wherein the at least one resilient member forms a distinct part of the stiffener frame.

Example 12 may include the semiconductor package of example 11 and/or any other example disclosed herein, wherein the at least one resilient member is attached to the stiffener by welding, soldering, or a mechanical means.

Example 13 may include the semiconductor package of example 1 and/or any other example disclosed herein, further including a heat sink or a heat pipe engaged to the at least one resilient member near the distal end.

Example 14 may include the semiconductor package of example 12 and/or any other example disclosed herein, wherein the heat sink or heat pipe is in contact with the at least one die.

Example 15 may include the semiconductor package of example 1 and/or any other example disclosed herein, wherein the at least one resilient member is formed of the same material as the stiffener and wherein the stiffener and the at least one resilient member are formed of a metal selected from the group consisting of aluminum, steel, titanium, copper, silicon carbide, other metal alloy composites, and metal alloy composites with surface treatment.

Example 16 may include the semiconductor package of example 1 and/or any other example disclosed herein, wherein the at least one resilient member is formed of a material different from the stiffener, wherein the stiffener and the at least one resilient member are independently formed of a metal selected from the group consisting of aluminum, steel, titanium, copper, silicon carbide, other metal alloy composites, and metal alloy composites with surface treatment.

Example 17 may include a computing device including a circuit board; and a semiconductor package coupled to the circuit board, the semiconductor package including a substrate; at least one die coupled to the substrate; a stiffener coupled to the substrate, wherein the stiffener includes a stiffener frame, wherein the stiffener frame at least partially surrounds the at least one die; the stiffener further including at least one resilient member extending from the stiffener frame towards the at least one die; and the at least one resilient member including a distal end that extends at a height above the substrate.

Example 18 may include the computing device of example 17 and/or any other example disclosed herein, wherein the distal end of the at least one resilient member is spaced apart from the at least one die.

Example 19 may include a method for forming a semiconductor package, the method including providing a substrate; coupling at least one die to the substrate; coupling a stiffener to the substrate, wherein the stiffener includes a stiffener frame, wherein the stiffener frame at least partially surrounds the at least one die, and the stiffener further including at least one resilient member extending from the stiffener frame towards the at least one die, and wherein the at least one resilient member includes a distal end that extends at a height above the substrate; and coupling a heat sink to the at least one die by having the heat sink first engage the at least one resilient member near the distal end before coming into contact with the at least one die.

Example 20 may include the method of example 19 and/or any other example disclosed herein, wherein the at least one resilient member further includes two resilient members extending from the stiffener frame towards the at least one die and wherein the coupling of the heat sink to the at least one die, the method further includes the heat sink engaging the two resilient members.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
   a substrate;
   at least one die coupled to the substrate;
   a stiffener coupled to the substrate, wherein the stiffener comprises a stiffener frame, wherein the stiffener frame at least partially surrounds the at least one die;
   the stiffener further comprising at least one resilient member extending from the stiffener frame towards the at least one die; and
   the at least one resilient member comprising a distal end that extends at a height above the substrate, wherein the distal end of the at least one resilient member is spaced apart from the at least one die, or the distal end of the at least one resilient member is in contact with one side of the at least one die, after an assembly of a heat sink or heat pipe, and wherein the two resilient members extends towards the at least one die from the same direction.

2. The semiconductor package of claim 1, wherein the distal end of the at least one resilient member is spaced apart from the at least one die, prior to an assembly of a heat sink or heat pipe.

3. The semiconductor package of claim 1, wherein the height of the distal end of the at least one resilient member is greater than a height of the at least one die, prior to an assembly of a heat sink or heat pipe.

4. The semiconductor package of claim 1, wherein the at least one resilient member further comprises two resilient members extending from the stiffener frame towards the at least one die, each of the two resilient members comprising a distal end that extends at a height above the substrate, prior to an assembly of a heat sink or heat pipe.

5. The semiconductor package of claim 4, wherein the distal end of each of the two resilient members has a height above the substrate that is the same, prior to an assembly of a heat sink or heat pipe.

6. The semiconductor package of claim 4, wherein each of the two resilient members has a distal end that extends at a different height above the substrate, prior to an assembly of a heat sink or heat pipe.

7. The semiconductor package of claim 4, wherein the two resilient members extends towards the at least one die from opposing directions.

8. The semiconductor package of claim 1, wherein the at least one resilient member forms an integral part of the stiffener.

9. The semiconductor package of claim 1, wherein the at least one resilient member forms a distinct part of the stiffener.

10. The semiconductor package of claim 9, wherein the at least one resilient member is attached to the stiffener by welding, soldering, or a mechanical means.

11. The semiconductor package of claim 1, further comprising a heat sink or heat pipe engaged to the at least one resilient member near the distal end.

12. The semiconductor package of claim 11, wherein the heat sink or heat pipe is in contact with the at least one die.

13. The semiconductor package of claim 1, wherein the at least one resilient member is formed of the same material as the stiffener and wherein the stiffener and the at least one resilient member are formed of a metal selected from the group consisting of aluminum, steel, titanium, copper, silicon carbide, other metal alloy composites, and metal alloy composites with surface treatment.

14. The semiconductor package of claim 1, wherein the at least one resilient member is formed of a material different from the stiffener, wherein the stiffener and the at least one resilient member are independently formed of a metal selected from the group consisting of aluminum, steel, titanium, copper, silicon carbide, other metal alloy composites, and metal alloy composites with surface treatment.

15. A method comprising:
   providing a substrate;
   coupling at least one die to the substrate;
   coupling a stiffener to the substrate, wherein the stiffener comprises a stiffener frame, wherein the stiffener frame at least partially surrounds the at least one die, and the stiffener further comprising at least one resilient member extending from the stiffener frame towards the at least one die, and wherein the at least one resilient member comprises a distal end that extends at a height above the substrate; and coupling a heat sink to the at least one die by having the heat sink first engage the at least one resilient member near the distal end before coming into contact with the at least one die.

16. The method of claim 15, wherein the at least one resilient member further comprises two resilient members extending from the stiffener frame towards the at least one die and wherein the coupling of the heat sink to the at least one die, the method further comprises the heat sink engaging the two resilient members.

* * * * *